(12) United States Patent
Mochizuki

(10) Patent No.: US 8,183,927 B2
(45) Date of Patent: May 22, 2012

(54) POWER AMPLIFIER

(75) Inventor: Ryo Mochizuki, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/850,399

(22) Filed: Aug. 4, 2010

(65) Prior Publication Data

US 2011/0187461 A1    Aug. 4, 2011

(30) Foreign Application Priority Data

Feb. 2, 2010  (JP) .................................. 2010-021567
Jul. 26, 2010  (JP) .................................. 2010-167470

(51) Int. Cl.
  *H03F 3/04*  (2006.01)
(52) U.S. Cl. ....................................... 330/289; 330/284
(58) Field of Classification Search .................. 330/284, 330/289, 310, 98, 133, 150
  See application file for complete search history.

(56) References Cited

U.S. PATENT DOCUMENTS

| 6,480,061 B2 * | 11/2002 | Dolman et al. | 330/289 |
| 7,375,588 B2 * | 5/2008 | Yamakawa et al. | 330/289 |
| 7,948,317 B2 * | 5/2011 | Wan | 330/289 |

FOREIGN PATENT DOCUMENTS

| JP | 02-279009 | 11/1990 |
| JP | 03-099503 | 4/1991 |
| JP | 03-266512 | 11/1991 |
| JP | 2007-082016 | 3/2007 |

OTHER PUBLICATIONS

Notice of Reasons for Rejection for Application No. 2010-167470, from the Japanese Patent Office, mailed Nov. 29, 2011.

* cited by examiner

*Primary Examiner* — Khanh Nguyen
(74) *Attorney, Agent, or Firm* — Finnegan, Henderson, Farabow, Garrett & Dunner, L.L.P.

(57) ABSTRACT

According to one embodiment, a variable attenuator is arranged in an input stage, a plurality of transistors are cascaded on the later part of this variable attenuator, temperature sensors are arranged in the vicinity of two or more of the plurality of transistors to detect temperatures, the amount of gain change of the plurality of transistors is calculated from the temperature detection results individually obtained by the temperature sensors, the variable attenuator is controlled in such a manner as to reduce the amount gain change so that the input signal level can be controlled, and thereby the gain that tends to vary in accordance with temperature changes can be stabilized.

4 Claims, 3 Drawing Sheets

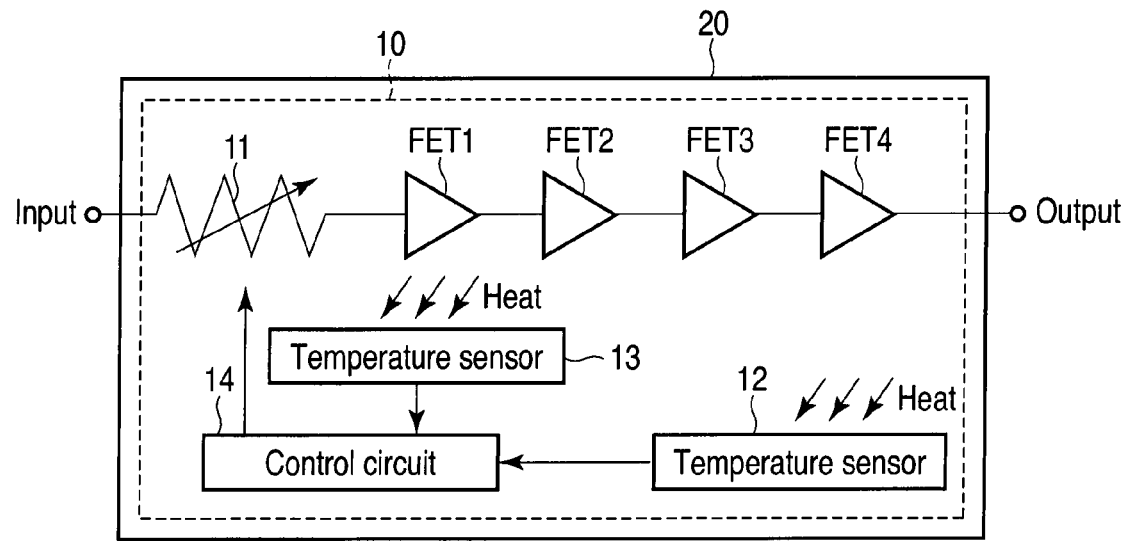
F I G. 1
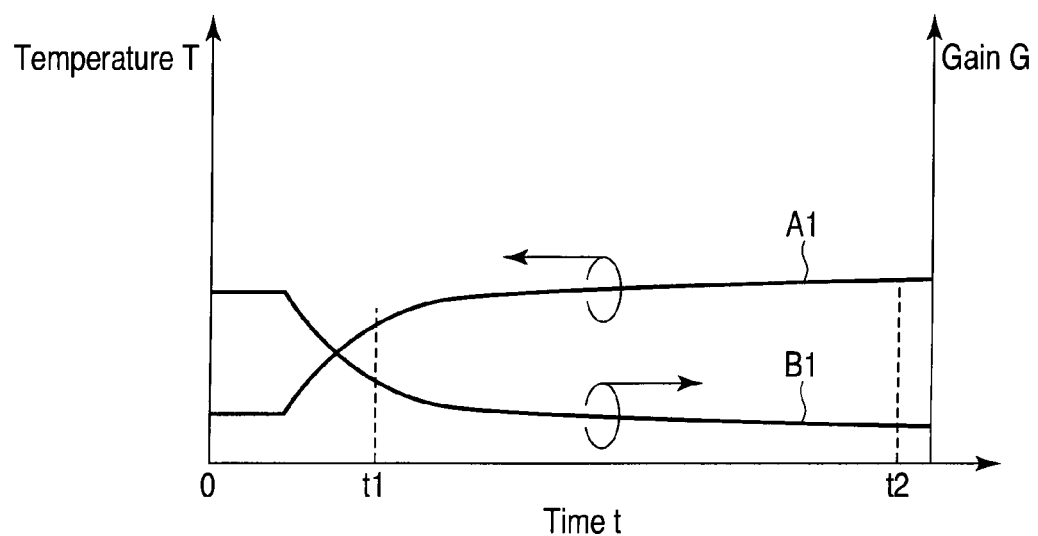
F I G. 2

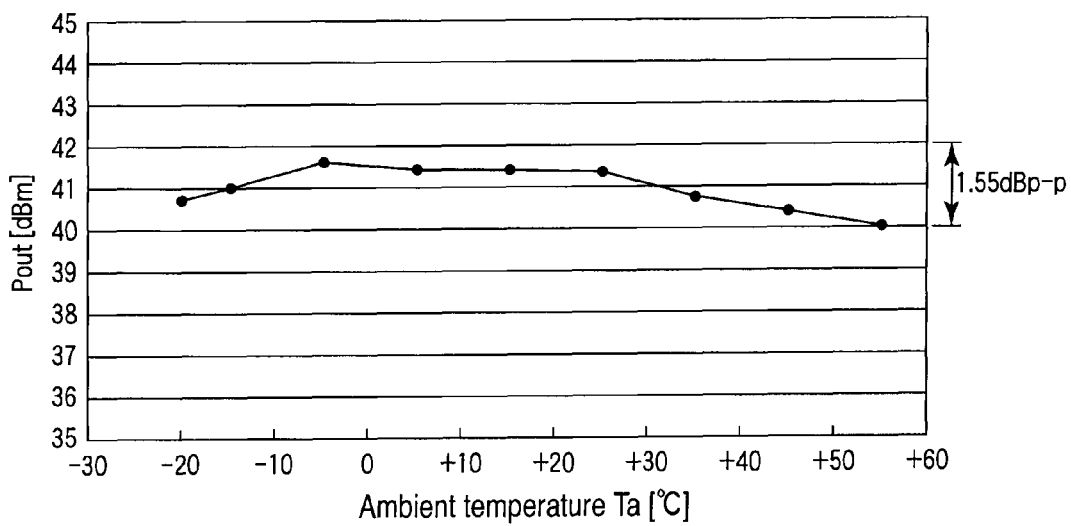
F I G. 5
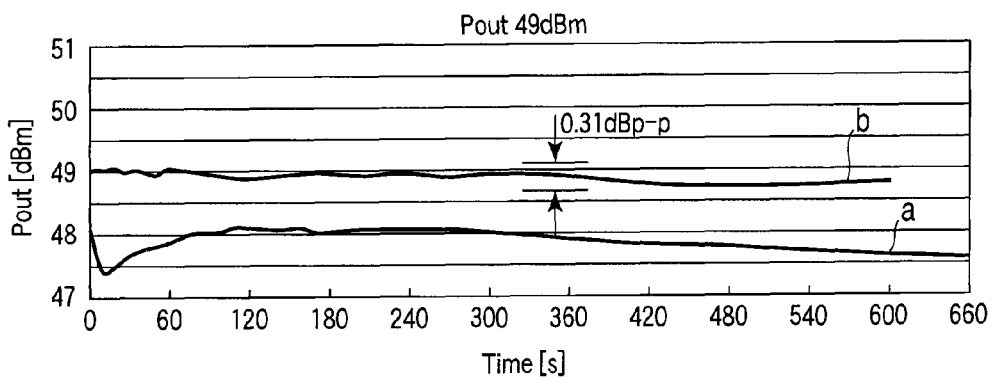
F I G. 6
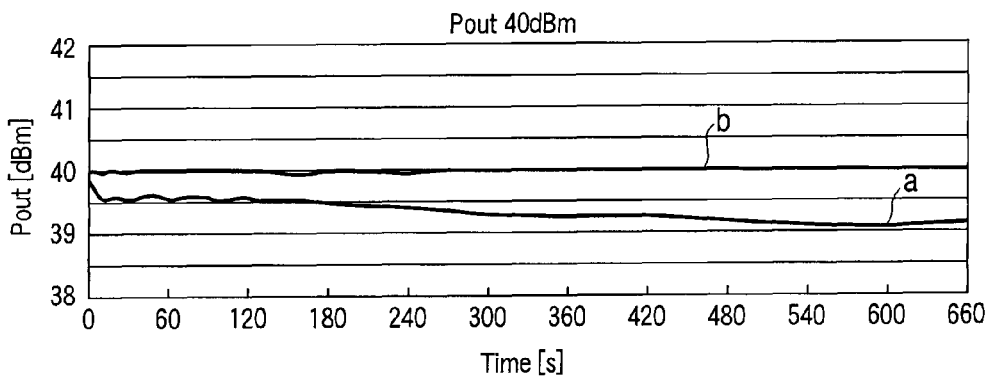
F I G. 7

POWER AMPLIFIER

CROSS-REFERENCE TO RELATED APPLICATIONS

This application is based upon and claims the benefit of priority from Japanese Patent Applications No. 2010-021567, filed Feb. 2, 2010; and No. 2010-167470, filed Jul. 26, 2010; the entire contents of both of which are incorporated herein by reference.

FIELD

Embodiments described herein relate generally to a power amplifier.

BACKGROUND

A satellite news gathering (SNG) system collects materials for broadcasting programs such as TV news by use of communication satellites. An earth station that collects the broadcasting materials is provided with a SNG vehicle and a flyaway (transportable earth station that is not vehicle-mounted). For such an SNG system, a solid state power amplifier (SSPA) incorporating a field-effect transistor (FET) is often adopted as a power amplifier to amplify transmission signals.

The SNG system generally uses the C band (4 to 8 GHz) or the Ku band (12 to 18 GHz) for satellite communications. For such frequency ranges, gallium arsenide FETs (GaAsFETs) are most commonly employed as power amplifying FETs. For example, because a GaAsFET obtains a gain of approximately 6 dB in the Ku band, multiple FETs need to be cascaded in order to achieve a gain as high as 60 dB that is required for the SNG system. When multiple FETs are cascaded, a compensating function is required to maintain the gain of the FETs constant because the gain tends to vary in accordance with the ambient temperature.

For instance, Jpn. Pat. Appln. KOKAI Publication No. 2007-82016 (paragraph 0014, FIG. 1) teaches a technology of arranging temperature sensors in the vicinity of a main amplifier circuit and a distortion signal amplifier circuit to monitor the temperatures of heater elements of the circuits and elements whose properties greatly change in accordance with the temperature. According to this technology, the gain properties of each element in relation to temperatures are stored in advance on a look-up table, and the table is used for temperature compensation.

When multiple FETs are cascaded in a SSPA, however, a small amount of heat is generated by the FETs on the first part, while a large amount of heat is generated by the FETs on the later part. This means that the temperature is not distributed evenly inside the SSPA. In addition, with a single temperature sensor provided in the vicinity of the amplifier circuit to detect the temperature at a single position, the gain variation incurred by a temperature change at any position other than the temperature detection position cannot be corrected.

BRIEF DESCRIPTION OF THE DRAWINGS

FIG. 1 is a block diagram for showing the structure of a power amplifier according to an embodiment.

FIG. 2 is a diagram for showing an example of variations in gain and measured temperature of a FET on the first part of the cascade at the time of cold-starting the power amplifier of FIG. 1.

FIG. 5 is a diagram for showing an amount of variation in the output level in an environment where the ambient temperature changes between −20 and 55° C., according to the above embodiment.

FIG. 6 is a diagram for showing the stability of the gain along the time axis for a high input level at the time of cold-starting.

FIG. 7 is a diagram for showing the stability of the gain along the time axis for a low input level at the time of cold-starting.

DETAILED DESCRIPTION

Figure 3:
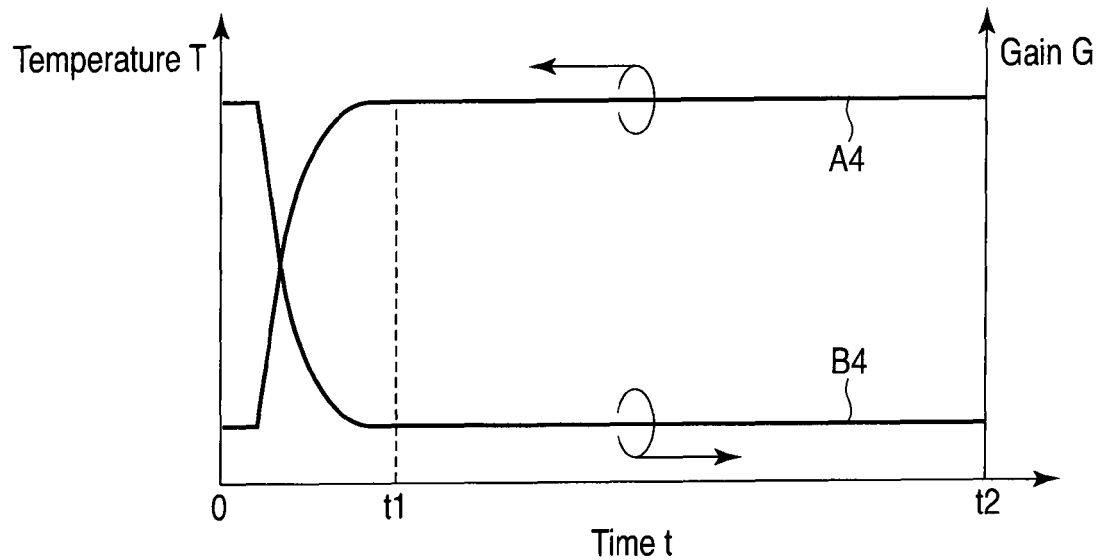
FIG. 3 is a diagram for showing an example of variations in gain and measured temperature of a FET on the later part of the cascade at the time of cold-starting the power amplifier of FIG. 1.

In general, according to one embodiment, a power amplifier includes a variable attenuator configured to control the input signal level; a plurality of transistors cascaded on the later part of the variable attenuator to amplify the power; a plurality of temperature sensors arranged in the vicinity of at least two of the plurality of transistors to detect temperature; and a controller configured to obtain an amount of change in gains of the plurality of transistors from the temperature detection results obtained by the temperature sensors and control the variable attenuator in such a manner as to reduce the amount of gain change so as to control the input signal level. In this manner, the gain that tends to vary in accordance with the temperature change can be stabilized.

Hereinafter, the embodiments of the power amplifier will be explained with reference to the attached drawings.

FIG. 1 is a block diagram for showing the structure of the power amplifier according to an embodiment. As illustrated in FIG. 1, a power amplifier 10 according to the embodiment is arranged on a cooling device (heat sink) 20. The power amplifier 10 may be used to amplify the transmission power for a SNG transportable earth station.

The power amplifier 10 includes a variable attenuator 11, four field-effect transistors (FETs) FET1 to FET4, temperature sensors 12 and 13 and a control circuit 14.

An input signal that is input from the input terminal is supplied to the FET1 by way of the variable attenuator 11. The FET1 to FET4 may be gallium arsenide FETs, and are cascaded as illustrated in FIG. 1. The input signal is amplified by these FETs to be transmission power, and is output through the output terminal. FIG. 1 shows an example arrangement of four FETs, but the number of FETs is not limited thereto. The cascade connection may partially include a parallel connection of FETs.

The temperature sensor 12 is arranged in the vicinity of the FET4 that is positioned in the last stage of the cascade to detect the temperature of the FET4. The detected temperature is sent to the control circuit 14. Further, the temperature sensor 13 is arranged in the vicinity of the FET1 that is positioned in the first stage of the cascade to detect the temperature of the FET1. The detected temperature is sent to the control circuit 14. FIG. 1 shows two temperature sensors as an example, but more temperature sensors may be arranged between the FET1 and the FET4. The temperature information detected by each temperature sensor is sent to the control circuit 14.

The control circuit 14 controls the variable attenuator 11, based on the results of the temperature detection obtained by the temperature sensors 12 and 13, and thereby compensates the entire gain $\Delta G$ of the power amplifier 10.

The thermal gradient of the gain of a gallium arsenide FET is commonly known as 0.015 [dB/° C.]. The gain of the gallium arsenide FET therefore increases at a lower temperature and decreases at a higher temperature. This is not limited to a gallium arsenide FET, but FETs formed of silicon crystal and of gallium nitride have similar temperature properties.

The gain variation ΔG of the FETs that are cascaded as illustrated in FIG. 1 can be generally expressed by Equation (1):

$$\Delta G[\text{dB}] = 0.015[\text{dB}/°\text{C.}] \times \Delta T[°\text{C.}] \times X[\text{stages}] \quad (1)$$

In Equation (1), X represents the number of stages in the cascade, and ΔT represents the temperature change.

For instance, when the cascade connection includes 10 stages of gallium arsenide FETs and the temperature changes from −20° C. to 60° C., the gain variation of 12[dB] is obtained by Equation (2).

$$\Delta G = 0.015 \times (60-(-20)) \times 10 = 12[\text{dB}] \quad (2)$$

In this manner, the gain variation of the SSPA can be expressed by a function uniquely determined in accordance with the temperature change. Thus, if the temperature change inside the SSPA is detected, the amount of gain to be compensated can be calculated by Equation (1).

When multiple FETs are connected in cascade, however, a small amount of heat is generated in the FET1 of the first stage, but a large amount of heat is generated in the FET4 in the last stage. The temperature distribution would therefore become uneven in the cooling device 20. For this reason, the amounts of temperature change and the change gradients differ according to the position of the power amplifier 10. The compensation process for keeping the gain constant becomes more difficult to perform if the gain variation widths due to such a temperature distribution are accumulated.

Especially on the first part of the cascade, heat is conducted by way of the cooling device 20 from the later part FETs that release a large amount of heat. For this reason, even after the later part FETs reach thermal equilibrium, the gain continues to change in the first part FETs because it takes longer for the first part FETs to reach thermal equilibrium (i.e., it takes longer to stabilize the temperature, which means that the time constant is large).

For this reason, with a system in which the temperature is detected at a single point in the power amplifier 10 to control the variable attenuator 11, the gain cannot be stabilized in a short period of time.

In addition, changes in the temperature of the power amplifier 10 are not caused by the ambient air only. The temperature may increase after cold-starting of the device, or may change due to an increase/decrease in the transmission output power depending on a type of line such as a video line and a communication line. Thus, the gain needs to be compensated in a time-sensitive manner in accordance with abruptly changes in temperature.

FIG. 2 shows an example of the change of the gain G and the change in the temperature T measured at the FET1 on the first part of the cascade when the device is cold-started. In FIG. 2, the graph A1 indicates the change of the temperature of the FET1 with time, and the graph B1 indicates the change of the gain of the FET1 with time.

Moreover, FIG. 3 shows an example of the change of the gain G and the change in the temperature T measured at the FET4 on the later part of the cascade when the device is cold-started. In FIG. 3, the graph A4 indicates the change in the temperature of the FET4 with time, and the graph B4 indicates the change of the gain of the FET4 with time.

As indicated in FIGS. 2 and 3, the gains abruptly change in both FETs, in accordance with abrupt changes in temperatures. In addition, the FET4 on the later part releases a large amount of heat, and therefore the gain greatly decreases. However, it does not take long to stabilize the temperature (i.e., the time constant is small). On the other hand, in the FET1 on the first part, it takes long to reach thermal equilibrium and stabilize the temperature (i.e., the time constant is large) because heat is conducted from the later part FET by way of the cooling device 20.

The power amplifier 10 according to the present embodiment is provided with multiple temperature sensors (temperature sensors 12 and 13), and thus changes in the temperatures can be detected at different temperature detection points. Hence, the temperature change detection in the cascaded FETs can be achieved with high sensitivity.

In the structure of FIG. 1, the temperature changes are detected at two positions of the FET cascade connection, the FET1 on the first part and the FET4 on the later part. The control circuit 14 determines an amount of control of the variable attenuator 11, based on the time change ΔT12 of the temperature detected by the temperature sensor 12 and the time change ΔT13 of the temperature detected by the temperature sensor 13.

The control circuit 14 divides the cascade connection, for example, into the first part connection of the FET1 and the FET2 and the later part connection of the FET3 and the FET4. Partial gain changes ΔG1 and ΔG2 for the connection portions are separately calculated by Equation (1), and then added to each other as indicated by Equation (3). The control circuit 14 can control the variable attenuator 11 in accordance with the gain change that is obtained by this addition.

$$\Delta G = \Delta G1 + \Delta G2 \quad (3)$$

where
ΔG1 = 0.015 × ΔT13 × 2 and
ΔG2 = 0.015 × ΔT12 × 2

It is assumed here that the temperature change in the first part connection of the FET1 and the FET2 is represented by the time change ΔT13 of the temperature detected by the temperature sensor 13 and that the temperature change in the later part connection of the FET3 and the FET4 is represented by the time change ΔT12 of the temperature detected by the temperature sensor 12. Furthermore, ΔG1 denotes the partial gain change for the first part connection of the FET1 and the FET2, and ΔG2 denotes the partial gain change for the later part connection of the FET3 and the FET4.

As indicated by Equation (3), the partial gain change ΔG1 for the first part connection of the FET1 and the FET2 is calculated by substituting ΔT13 into ΔT and 2 into X of Equation (1). In a similar manner, the partial gain change ΔG2 for the later part connection of the FET3 and the FET4 is calculated by substituting ΔT12 into ΔT and 2 into X of Equation (1).

The control circuit 14 controls the variable attenuator 11, based on ΔG, which is the sum of ΔG1 and ΔG2 (=ΔG1+ΔG2), to conduct the gain compensation.

In calculation of the partial gain changes ΔG1 and ΔG2, the cascade connection may be divided in a different manner.

For example, the cascade connection may be divided into the first part connection of the FET1 only and the later part connection of the FET2, the FET3 and the FET4. In this case also, the partial gain changes ΔG1 and ΔG2 are calculated by Equation (1) separately for the connection portions and added to each other by Equation (4). The variable attenuator 11 is thereby controlled, in accordance with the gain change that is obtained from this addition.

$$\Delta G = \Delta G1 + \Delta G2 \quad (4)$$

where
ΔG1 = 0.015 × ΔT13 × 1 and
ΔG2 = 0.015 × ΔT12 × 3

Here, ΔG1 represents the partial gain change in the FET1, and ΔG2 represents the partial gain change in the later part connection of the FET2 to the FET4. ΔG1 is calculated by substituting ΔT13 into ΔT and 1 into X of Equation (1). Similarly, ΔG2 is calculated by substituting ΔT12 into ΔT and 3 into X of Equation (1).

The control circuit 14 controls the variable attenuator 11, based on ΔG, which is the sum of ΔG1 and ΔG2 (=ΔG1+ΔG2), to conduct the gain compensation. When adding ΔG1 and ΔG2, weights may be assigned to these values. In addition, the control circuit 14 may be configured to control the manner of dividing the cascade connection in accordance with the surrounding environment and use of the power amplifier 10.

Still further, the control circuit 14 may be configured to compare ΔT12 and ΔT13 and control the temperature gain compensation based on a larger rate of change. For example, when the device is cold-started, or when the temperature varies in accordance with the increase/decrease of the transmission power, the temperature change is greater in the FET4 on the later part. If this is the case, the temperature gain compensation is conducted by controlling the variable attenuator 11 based on the change ΔT12 in the temperature detected by the temperature sensor 12.

Thereafter, at time t1 in FIG. 3, when the temperature detected by the temperature sensor 12 is stabilized (ΔT12=0), the control circuit 14 is switched so that the gain control for the temperature compensation is conducted based on the detection results obtained by the temperature sensor 13. As indicated in FIG. 2, the temperature of the first part FET1 still gradually changes after the time t1 due to the heat conducted from the later part. Thus, after the time t1, the gain compensation is performed base on ΔT13. Then, at time t2 of FIG. 2, the temperature detected by the temperature sensor 13 is stabilized (ΔT13=0).

Thereafter, the control circuit 14 may still compare the time changes ΔT12 and ΔT13 in the temperatures detected by temperature sensor 12 and 13 and perform the temperature gain compensation base on the larger temperature change. By designing the control circuit 14 to switch the temperature sensors with hysteresis, the temperature sensors can be prevented from being switched back and forth too often in accordance with a subtle temperature change.

Figure 4:
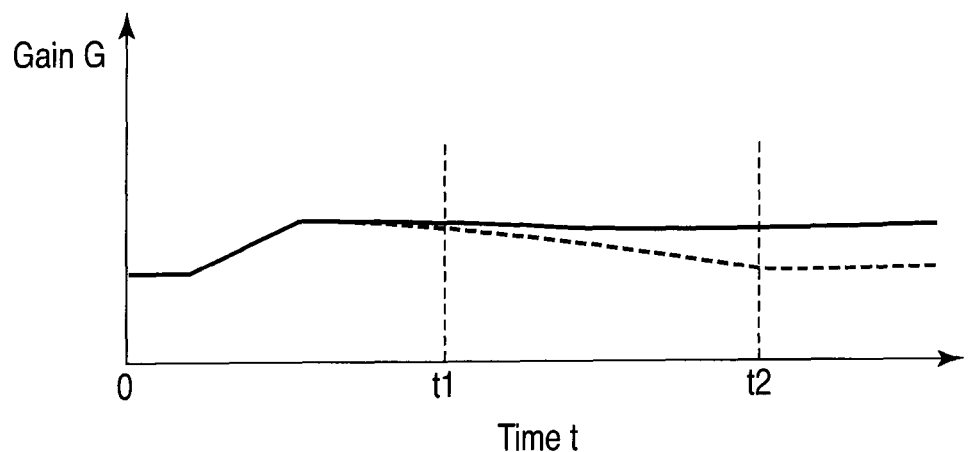
FIG. 4 is a diagram for showing an example of variation of the entire gain of the power amplifier with time according to the above embodiment.

FIG. 4 shows examples of changes with time in the entire gain of the power amplifier 10 according to the present embodiment. In FIG. 4, the solid line represents a time change in the entire gain of the power amplifier 10 according to the present embodiment. The broken line represents a time change in the gain when the temperature compensation is performed based on the calculation of Equation (1) using a temperature detected at a single point.

As indicated in FIG. 4, it takes shorter to stabilize the gain (i.e., the time constant is small) according to the present embodiment where temperature detection is performed at multiple positions than with the temperature detection of a single position. For this reason, the present embodiment can deal with abrupt temperature changes in a more sensitive manner.

Furthermore, because the fluctuation range of the gain (the change amount in a vertical direction of the graph) is reduced, the gain can be sufficiently stabilized even when the temperature increases after cold-starting or when the temperature abruptly changes in accordance with the increase/decrease of the transmission output.

According to the above embodiment, it is assumed that the temperature property of the variable attenuator 11 is an ideal one. In actuality, however, the element of the variable attenuator 11 has its own temperature property, which exhibits different tendencies depending on the amplitude level of an input signal and the designated amount of attenuation.

For this reason, the power amplifier 10 may be configured such that the temperature detection is performed in the vicinity of the variable attenuator 11 as well as in the vicinity of the FETs, the amount of temperature change is calculated to find the amount of temperature gain compensation, and this compensation amount is added to the amount of temperature gain compensation corresponding to the temperature change in the vicinity of the FETs. In this manner, the entire gain can be compensated, with the change in the temperature property of the variable attenuator 11 taken into account.

Specific examples of the power amplifier 10 according to the present embodiment are illustrated in FIGS. 5 to 7.

FIG. 5 indicates the amount of change in the output level under an environment in which the ambient temperature changes in the range of −20 to 55° C. FIG. 5 shows that the output is substantially stabilized (within the range of 1.55 dB), irrespective of the ambient temperature.

FIGS. 6 and 7 show the gain stability with respect to the time axis at the time of cold-starting. In FIG. 6, the input level is high, whereas in FIG. 7, the input level is low. The graph a represents the conventional technology, and the graph b represents the present embodiment.

As can be seen from these properties, the fluctuation can be suppressed to the range of 0.31 dB even with a high input level. With a low input level, the gain can be kept substantially constant.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplifier comprising:
a variable attenuator configured to control a level of an input signal;
a plurality of transistors cascaded on a later part of the variable attenuator to receive the input signal through the variable attenuator;
a plurality of temperature sensors arranged in vicinity of at least two of the plurality of transistors to individually detect temperatures; and
a controller configured to calculate an amount of gain change of the plurality of transistors from temperature detection results individually obtained by the plurality of temperature sensors, control the variable attenuator in such a manner as to reduce the amount of gain change, and thereby control the level of the input signal.

2. The power amplifier according to claim 1, wherein:
any one of the plurality of temperature sensors is arranged in the vicinity of an output stage of the plurality of transistors to detect the temperature; and
the controller calculates changes of the temperatures detected by the plurality of temperature sensors, calculates amounts of gain changes for connection portions of the cascaded transistors based on the changes of the temperatures, adds the calculated amounts of gain changes, and controls the variable attenuator based on a result of addition.

3. The power amplifier according to claim 1, wherein:
the controller controls the variable attenuator, based on a detection result having the largest time change among the temperature detection results obtained by the plurality of temperature sensors.

4. The power amplifier according to claim 1, wherein:
any one of the plurality of temperature sensors is arranged in the vicinity of the variable attenuator to detect a temperature; and
the controller calculates an amount of temperature compensation of the variable attenuator based on a detection result of the temperature in the vicinity of the variable attenuator, adds the amount of temperature compensation to the amount of gain change, and controls the variable attenuator based on an addition result.

* * * * *